US010554000B2

(12) United States Patent
Pradier et al.

(10) Patent No.: US 10,554,000 B2
(45) Date of Patent: Feb. 4, 2020

(54) ASSEMBLY FOR PROTECTION BOARDS OF A DISTRIBUTION SYSTEM

(71) Applicant: Zodiac Aero Electric, Montreuil (FR)

(72) Inventors: Jean-Clair Pradier, Houilles (FR); Frédéric Pinard, Maisons Alfort (FR)

(73) Assignee: Zodiac Aero Electric, Montreuil (FR)

( * ) Notice: Subject to any disclaimer, the term of this patent is extended or adjusted under 35 U.S.C. 154(b) by 241 days.

(21) Appl. No.: 14/827,032

(22) Filed: Aug. 14, 2015

(65) Prior Publication Data
US 2016/0049760 A1 Feb. 18, 2016

(30) Foreign Application Priority Data

Aug. 14, 2014 (FR) ..................... 14 57846

(51) Int. Cl.
*H01R 27/02* (2006.01)
*H01R 12/72* (2011.01)
*H01R 31/02* (2006.01)

(52) U.S. Cl.
CPC .................. *H01R 27/02* (2013.01)

(58) Field of Classification Search
CPC ...... H01R 27/02; H01R 31/02; H01R 12/721; H01R 13/631; H05K 7/1449; H05K 7/1457; H05K 1/14; H05K 1/141; H05K 2201/044; H05K 2201/049; G06F 1/185
USPC ............. 439/60, 78, 629, 638, 639; 361/679.01–679.4; 307/11, 147
See application file for complete search history.

(56) References Cited

U.S. PATENT DOCUMENTS

| 4,179,172 A * | 12/1979 | Godsey ................ H05K 7/1439 361/785 |
| 5,376,011 A | 12/1994 | Rudy, Jr. et al. |
| 6,247,078 B1 * | 6/2001 | Ebert ................. H05K 7/20718 361/725 |
| 6,456,203 B1 * | 9/2002 | Schomaker ............. H02B 1/34 174/651 |

(Continued)

FOREIGN PATENT DOCUMENTS

| CN | 103677152 A | 3/2014 |
| EP | 0 011 300 A2 | 6/2000 |

(Continued)

OTHER PUBLICATIONS

"Modul R: Board to Board & Board to Harness Interconnect Solutions," Modul R Catalogue, Amphenol Socapex, <http://www.amphenol-socapex.com/wp-content/themes/amphenol_socapex_theme/dowloads/pdf/Catalogue%20Modul%20R.pdf>, Jun. 2013, 40 pages.

(Continued)

*Primary Examiner* — Edwin A. Leon
*Assistant Examiner* — Milagros Jeancharles
(74) *Attorney, Agent, or Firm* — Christensen O'Connor Johnson Kindness PLLC

(57) ABSTRACT

Connection system arranged in a rack, for connecting at least one protection board (13a, 13b) of an electrical distribution system of an aircraft with a primary power supply, to at least one powered device (8a, 8b) and to a motherboard arranged in the rack.
The connection system includes at least one modular connector on each protection board and, for each protection board capable of being inserted in the rack, at least one additional modular connector attached at least partly on the rack and at least one additional connector connected to the motherboard.

10 Claims, 4 Drawing Sheets

(56) References Cited

U.S. PATENT DOCUMENTS

| | | | |
|---|---|---|---|
| 6,504,730 B1 | 1/2003 | Cooney | |
| 6,592,401 B1 | 7/2003 | Gardner | |
| 6,621,713 B2* | 9/2003 | Amaike | G06F 1/18 174/15.2 |
| 6,937,461 B1* | 8/2005 | Donahue, IV | H01R 13/514 174/50 |
| 7,101,188 B1* | 9/2006 | Summers | H01R 12/725 439/59 |
| 7,309,246 B1* | 12/2007 | Walter | H01R 13/6485 439/181 |
| 7,440,262 B2* | 10/2008 | Coffey | H02B 1/04 361/627 |
| 7,830,043 B1* | 11/2010 | Michael | G06F 1/189 307/149 |
| 7,927,130 B2* | 4/2011 | Fukuda | H01R 13/641 439/488 |
| 8,369,069 B2* | 2/2013 | Osternack | H05K 7/1424 244/1 R |
| 8,395,900 B2* | 3/2013 | Schrempp | G06F 1/189 361/729 |
| 8,743,552 B2* | 6/2014 | Tian | G06F 3/0658 361/679.31 |
| 8,749,986 B1* | 6/2014 | Peterson | H05K 1/117 174/254 |
| 9,136,652 B2* | 9/2015 | Ngo | H01R 24/00 |
| 9,160,088 B2* | 10/2015 | Rossman | H01R 12/7005 |
| 9,281,717 B2* | 3/2016 | Bailey | H05K 7/1492 |
| 9,474,181 B2* | 10/2016 | Bailey | H05K 7/1492 |
| 2002/0072255 A1* | 6/2002 | Leman | G06F 1/184 439/61 |
| 2003/0002641 A1 | 1/2003 | Schmokel | |
| 2003/0016520 A1 | 1/2003 | Cooney et al. | |
| 2003/0081386 A1 | 5/2003 | Robillard et al. | |
| 2003/0235025 A1* | 12/2003 | Amaike | G06F 1/18 361/600 |
| 2004/0184249 A1 | 9/2004 | Aguinaga, Jr. et al. | |
| 2004/0195446 A1* | 10/2004 | Smallhorn | B64D 11/0015 244/118.5 |
| 2004/0257762 A1* | 12/2004 | Shih | G06F 1/183 361/679.48 |
| 2005/0018388 A1* | 1/2005 | Shih | G06F 1/181 361/679.02 |
| 2006/0009051 A1* | 1/2006 | Schuylenbergh | H01R 12/78 439/67 |
| 2006/0203460 A1 | 9/2006 | Aviv | |
| 2008/0122289 A1* | 5/2008 | Best | H05K 7/1457 307/25 |
| 2010/0049893 A1* | 2/2010 | Drako | G06F 13/409 710/301 |
| 2011/0310550 A1* | 12/2011 | Xu | G06F 1/20 361/679.33 |
| 2012/0020008 A1* | 1/2012 | Dunwoody | H05K 7/1492 361/679.46 |
| 2012/0069519 A1* | 3/2012 | Caron | H05K 7/20636 361/691 |
| 2013/0070411 A1* | 3/2013 | Liang | G06F 1/185 361/679.31 |
| 2013/0088843 A1* | 4/2013 | Cong | G06F 1/185 361/785 |
| 2013/0164952 A1* | 6/2013 | Wu | H05K 1/142 439/62 |
| 2014/0160664 A1* | 6/2014 | Yang | G06F 1/185 361/679.32 |
| 2014/0293523 A1* | 10/2014 | Jau | H05K 7/14 361/679.4 |
| 2014/0365698 A1* | 12/2014 | Richard | G06F 13/4022 710/300 |
| 2015/0012680 A1* | 1/2015 | Tian | G06F 13/409 710/301 |
| 2015/0123612 A1* | 5/2015 | Ide | B60L 11/1812 320/109 |
| 2015/0163952 A1* | 6/2015 | Rossman | H02G 3/18 361/788 |
| 2015/0282319 A1* | 10/2015 | Salzman | H05K 1/141 361/788 |
| 2016/0294081 A1* | 10/2016 | Tsang | H01R 12/7005 |
| 2016/0352097 A1* | 12/2016 | Engelvin | H02H 1/0038 |

FOREIGN PATENT DOCUMENTS

| | | |
|---|---|---|
| FR | 2 786 326 A1 | 5/2000 |
| WO | 00/31844 A1 | 6/2000 |
| WO | 02/23688 A2 | 3/2002 |

OTHER PUBLICATIONS

UK Patents Act 1977: Search Report Under Section 17(5), dated Feb. 8, 2016, in corresponding Application No. GB 1514128.6, 2 pages.

French Search Report and Written Opinion dated Apr. 17, 2015, issued in French Application No. 1457846, filed Aug. 14, 2014, 9 pages.

Izquierdo, D., et al., "Protection Devices for Aircraft Electrical Power Distribution Systems: A Survey," Proceedings of the 34th Annual Conference of IEEE: Industrial Electronics (IECON 2008), Nov. 10-13, 2008, Orlando, Fla., pp. 903-908.

* cited by examiner

ASSEMBLY FOR PROTECTION BOARDS OF A DISTRIBUTION SYSTEM

The invention relates to the technical field of electrical connection systems with heavy and weak current systems, and more particularly such electrical connection systems for aircraft electrical distribution systems.

An aircraft in general has an electrical system notably including a primary electrical power distribution system and a secondary distribution system. This secondary distribution system is used to distribute electrical power and protect the distribution lines between powered devices and internal sources, such as generators or batteries, or external sources, such as ground power units.

The secondary distribution system includes several circuit boards, notably communication and calculation boards (EDMU) and protection boards (SSPC) arranged in one or more racks provided with a motherboard, supplying and connecting the communication and calculation boards and the protection boards.

A protection board is provided with an input connector 1, an output connector 2 and a service connector 3 for supplying power and exchanging data between on the one hand a microprocessor 5 and a power member 4 and, on the other hand, the rest of the system, notably the primary power supply 7, the loads 8, and, via the motherboard 6, the power supply of the board 9, discrete inputs 10 and aircraft or internal buses 11. In the prior art, a conventional printed circuit board connector is known as illustrated in FIG. 1 including the three connectors referenced 1, 2 and 3. These connectors 1, 2, 3 are standard printed circuit board connectors, e.g. of the SubD or DIN41612 type.

As has been mentioned above, a protection board is plugged into a rack that comprises the motherboard provided with connectors compatible with the connectors of the protection board. The motherboard is arranged at the bottom of the rack so that when a protection board is fully inserted it enables the motherboard connectors to make contact with the connectors of the protection board. Then the motherboard provides the connection via power tracks and additional connectors or power terminal blocks, to the primary core, the connection to the loads via the aircraft wiring and the connection to the service signals.

This offers the advantage of having compact, standard and inexpensive circuit board connectors. However, this comes at the cost of installing a power motherboard, with additional external connectors, which at the global level, cancels out the cost advantage obtained in the plug-in protection board.

The association of connectors compatible with the connectors used for the electrical harnesses of the aircraft and a standard printed circuit board connector is known from the prior art. Connectors compatible with the connectors of aircraft electrical harnesses are connectors 1 and 2 described in FIG. 1, the printed circuit board connector is connector 3. One such arrangement is described in document U.S. Pat. No. 6,504,730.

The two connectors 1 and 2 may be directly connected to the aircraft wiring. In this case, the rack is designed with an opening at the bottom allowing these connectors to extend outside the rack. The back plate of the rack comprises mechanisms for engaging the aircraft connectors that allow the protection board to be withdrawn while leaving the aircraft connectors in place.

The connector 3 is a printed circuit connector which is connected to a connector on the motherboard. The latter thus does not comprise any power connector, but only small signal connectors for connecting the service signals of the boards to the aircraft circuits (power supply, bus, discrete, etc.).

The protection board is therefore provided with at least two different connectors.

This offers the advantage of having a motherboard reduced to a minimum and a direct connection between the protection boards and the aircraft wiring.

However, the connectors have a significant height and the mechanical design is tricky because of the positioning tolerances between the connectors.

One object of the invention is a connection system arranged in a rack, for connecting at least one protection board of an electrical distribution system of an aircraft with a primary power supply, to at least one powered device and to a motherboard arranged in the rack.

The connection system includes at least one modular connector on each protection board and, for each protection board capable of being inserted in the rack, at least one additional modular connector attached at least partly on the rack and at least one additional connector connected to the motherboard.

The modular connector on a protection board may be integral and include an input connection module, an output connection module and a service connection module, the input connection module being capable of connecting the protection board to the power supply line, the output connection module being capable of connecting the protection board to at least one powered device, and the service connection module being capable of connecting the protection board to the motherboard.

The input connection module may be a connector.

The input connection module may be a set of power conductor tracks.

The additional modular connector attached at least partly on the rack may include power slots capable of engaging with the power conductor tracks of a protection board, the power slots being powered via busbars connected to the power supply line via at least one terminal block.

The modular connector may incorporate a centring pin.

The input connection module may include three phases and a neutral.

The input connection module may include three phases.

The input connection module may include one phase and a neutral.

The input connection module may include one phase.

The input connection module may include two phases.

The input connection module may include two phases and a neutral.

Another object of the invention is a rack including a lateral panel open on two opposite sides, intended to accommodate at least one protection board inserted into the rack via one first open side of the lateral panel.

The other open side of the lateral panel is closed by a perforated panel plate provided with a motherboard on the inner face thereof with respect to the rack, the rack including at least one additional modular connector connected to the power supply and to at least one powered device of the aircraft. The modular connectors of the protection boards inserted in the rack, and the additional modular connectors attached at least partly on the rack form connection systems as described above.

The connection system offers the advantage of an optimized connector height and control of the positioning tolerances of the connection functions between same and in the rack.

DESCRIPTION OF THE DRAWINGS

Other objects, features and advantages of the invention will appear on reading the following description, given solely as a non-restrictive example with reference to the accompanying drawings in which.

DETAILED DESCRIPTION

The connection system includes a rack, at least one first modular connector on a protection board, at least one second additional modular connector attached at least partly on the rack and at least one third additional connector connected to a motherboard arranged at the bottom of the rack.

Each modular connector includes at least one connection module capable of establishing a connection with an additional connection module or an additional connector.

Figure 1:
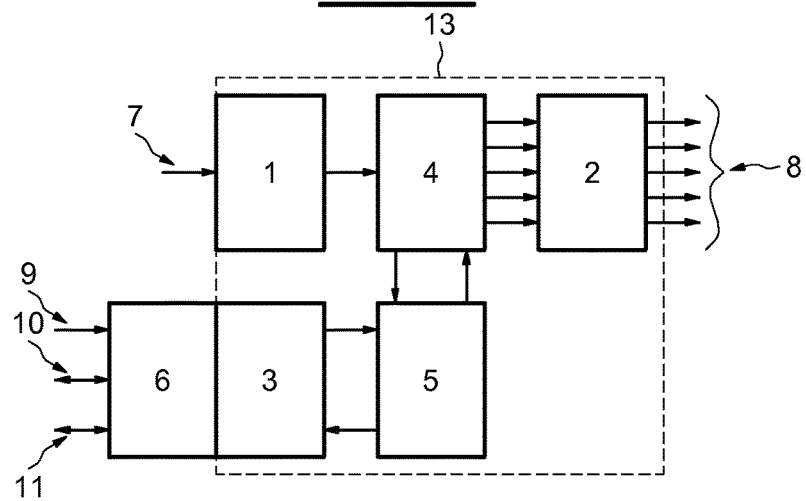
FIG. 1 illustrates the main elements of a conventional printed circuit board connector according to the prior art.
Figure 2:
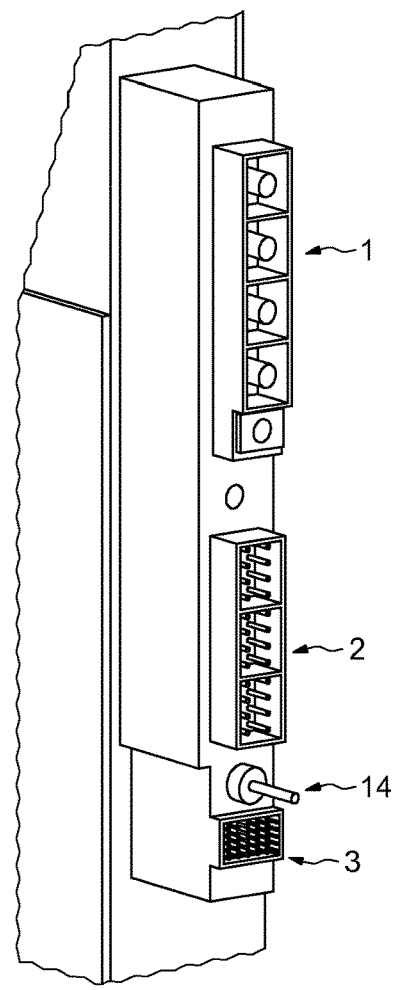
FIG. 2 illustrates a connector according to the invention.

The first modular connector is integral and includes an input connection module referenced 1, an output connection module referenced 2 and a service connection module referenced 3. FIG. 2 illustrates such a modular connector on a protection board.

The input connection module 1 and the output connection module 2 are separated in order to allow the use of different aircraft sockets for power input and for the wiring to the loads.

In other words, the input connection is connected to a power source, supplying a power generally of the three-phase AC or DC type. The output connection is connected to the loads or powered devices of the aircraft and carries voltages equivalent to the input voltage in nature.

The modular connector also incorporates a centring pin referenced 14, which, unlike the second prior art mentioned in the introduction, ensures the alignment of the protection board connection modules with the connection modules and connectors present at the bottom of the rack, at one go and with very good accuracy (that of the body of the connector, which is a monolithic part).

The connection modules included in a modular connector are selected for their ability to ensure the required electrical connection (high power contacts for the input connections 1, medium power contacts for the output connections 2, signal contacts for the service connection 3).

In FIG. 2, the input connection module includes three phases and a neutral. This corresponds to the case of an AC protection board. The input connection module includes a single potential in the case of a DC protection board. Other variants are possible, such as three phases only for an AC protection board or one potential and an earth in the case of a DC protection board, or two phases with or without neutral in the case of a DC high voltage protection board.

Figure 3:
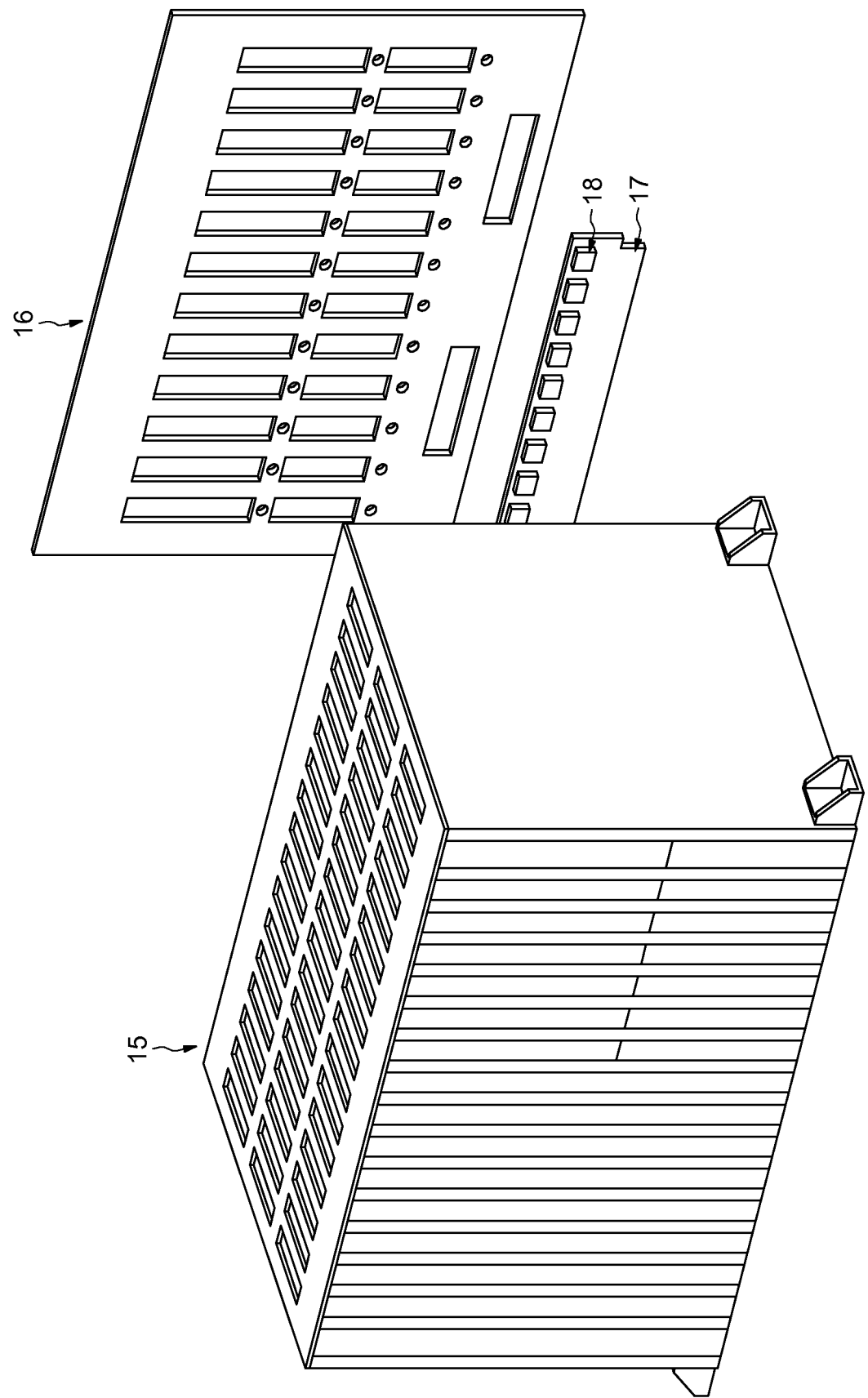
FIG. 3 illustrates a rack for protection boards.

FIG. 3 illustrates a rack intended for accommodating at least one protection board including a lateral panel 15 open on two opposite sides.

Protection boards are inserted into the rack via a first open side of the lateral panel 15.

The other open side of the lateral panel 15 is closed by a perforated panel plate 16 provided with a motherboard 17 on the inner face thereof with respect to the rack.

The modular connectors of the protection boards inserted in the rack form a connection with the additional modular connectors attached at least partly on the rack and connected to the power supply and to the loads.

For this, the perforated panel plate 16 includes passages for attaching and, in some cases, at least partially inserting additional input and output modular connectors for each protection board.

Furthermore, the motherboard 17 arranged at the bottom of the rack itself also includes additional connectors 18 that interface with the service connection module 3 of each protection board.

In some configurations, the power supply from the electrical core is common to multiple protection boards. In this case, a connection system according to a second embodiment is employed.

For this, a terminal block 19 is installed on the rear of the rack and busbars 19a, 19b distribute power between this terminal block 19 and power slots 7a, 7b.

Figure 4:
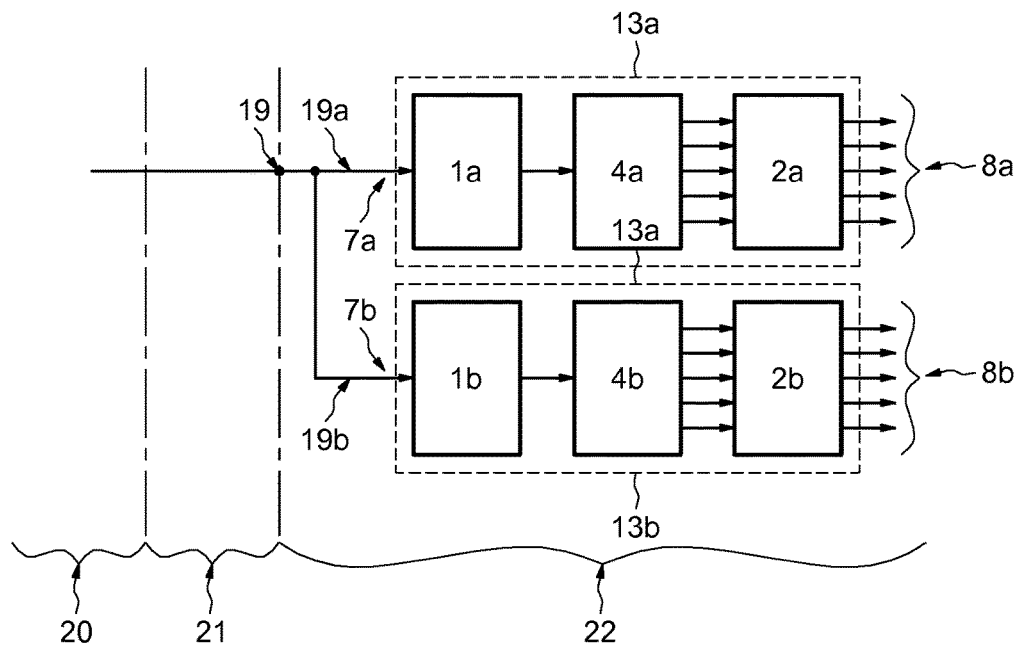
FIG. 4 illustrates a schematic diagram of a connection system according to a second embodiment.

Furthermore, the input connection module 1 then includes power tracks. The input connection is then formed by placing in contact the power slots 7a, 7b of the additional modular connector attached to the rack and the power tracks of the protection board. FIG. 4 illustrates a schematic diagram of such an embodiment.

As can be seen, a power line from the primary core 20 is connected to a terminal block 19 in a wiring area 21. At the output of this terminal block 19, busbars 19a and 19b carry the electrical power intended for two protection boards 13a and 13b reciprocally via power slots 7a and 7b. In this view, only the main components for powering the loads 8a, 8b from the power line are represented. However, the other control components, such as the microprocessor 5 and the service connector 3, are also included in each protection board although not represented.

The terminal block 19, busbar, slot and protection board assembly is arranged in the rack 22.

Figure 5:
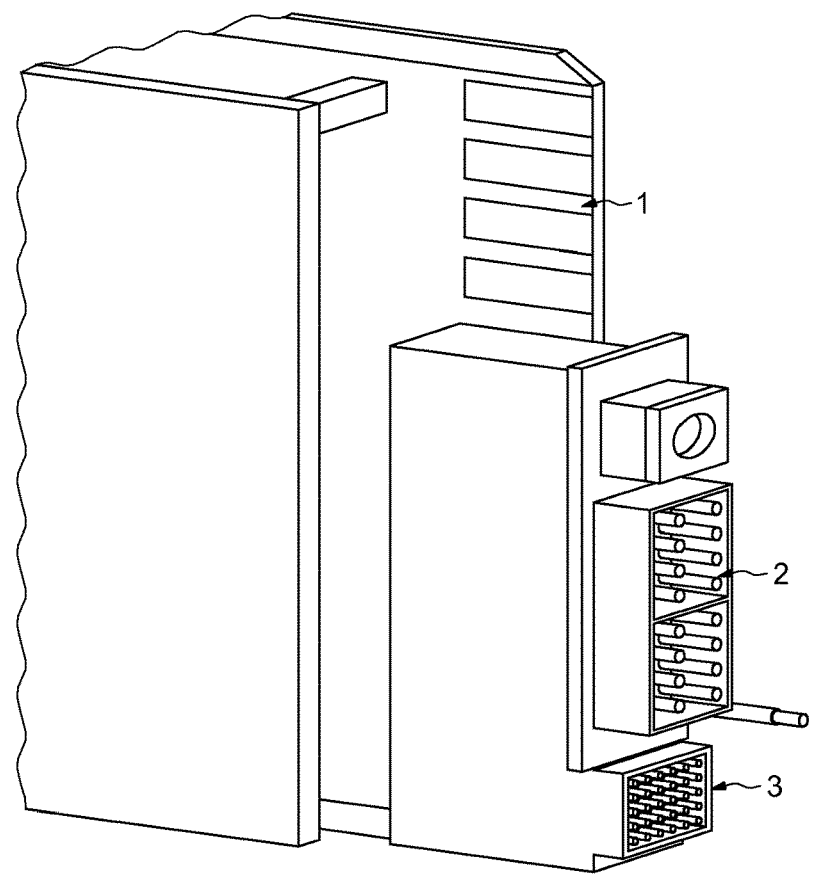
FIG. 5 illustrates the protection board connector according to the second embodiment.

FIG. 5 illustrates the protection board modular connector according to the second embodiment. As can be seen, it includes power tracks 1 and, unchanged with respect to the protection board modular connector according to the first embodiment, an output connection module 2, a service connection module and 3 a centring pin for a correct alignment of the modular connectors with the connectors and additional modular connectors attached at least partly on the rack.

Figure 6:
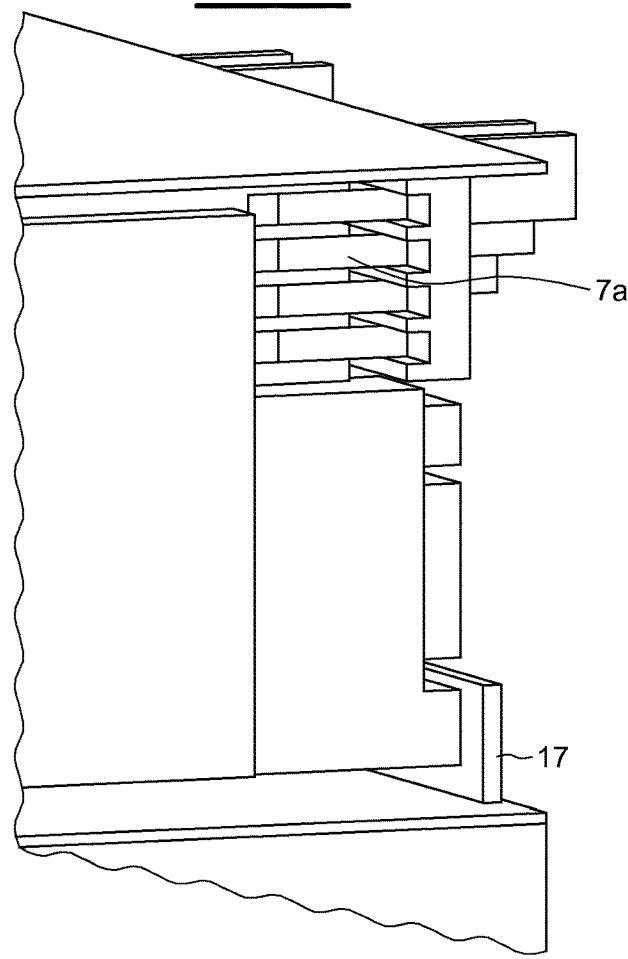
FIG. 6 illustrates a normal incidence view of the power slots of a protection board connector.

FIG. 6 illustrates a normal incidence view of the power slots 7a. The motherboard 17 can also be seen.

Figure 7:
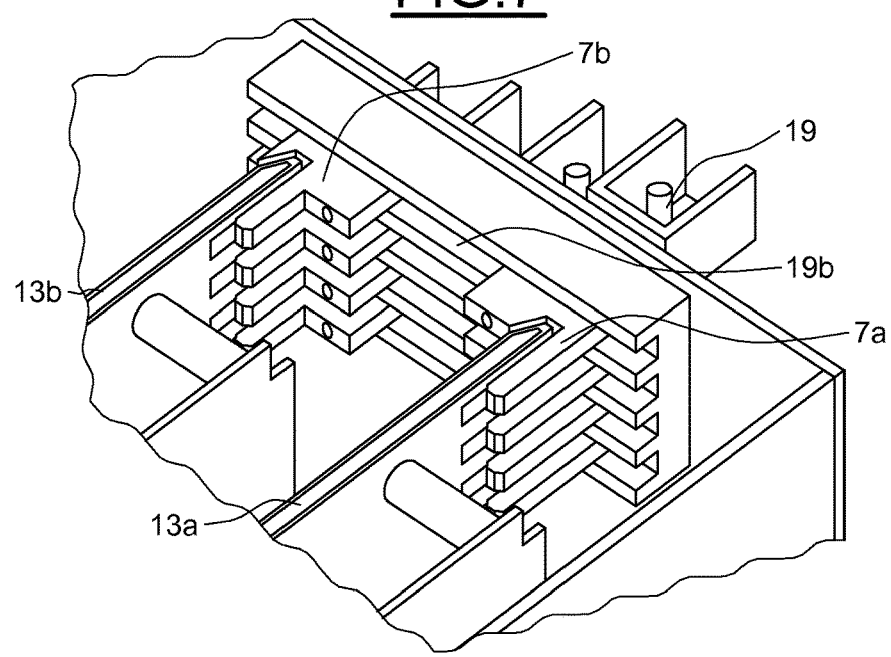
FIG. 7 illustrates another point of view of the power slots.

FIG. 7 illustrates another point of view of the power slots 7a, 7b. It is possible to simultaneously see the protection board power tracks and the power slots 7a, 7b connected by busbars 19b to a terminal block 19. FIG. 7 also illustrates two protection boards 13a, 13b inserted so that the power tracks are in contact with the power slots 7a, 7b.

The embodiments of the invention in which an exclusive property or privilege is claimed are defined as follows:

1. An assembly comprising:
    a rack;
    at least one protection board capable of being inserted in the rack; wherein the at least one protection board comprises at least one modular connector and an input connection module, and wherein the input connection module is a set of power conductor tracks and the at least one modular connector on the at least one protection board is integral and includes an output connection module and a service connection module;

at least one additional modular connector attached at least partly on the rack; and a motherboard comprising at least one additional connector, wherein the assembly connects the input connection module and the output connection module of the at least one protection board respectively to a primary power supply and to at least one load through the at least one additional modular connector, wherein the assembly connects the service connector module of the at least one protection board to the at least one additional connector of the motherboard, and wherein the at least one protection board comprises a front surface facing the rack and at least one side surface which is oriented to face perpendicular to the front surface, the set of power conductor tracks is disposed on the at least one side surface connecting the at least one protection board to the primary power supply, the output connection module is disposed on the side surface and oriented facing the rack connecting the at least one protection board to the at least one load, and the service connection module is disposed on the side surface oriented facing the rack connecting the at least one protection board to the motherboard.

2. The assembly according to claim 1, in which the at least one additional modular connector attached at least partly on the rack includes power slots capable of engaging with the set of power conductor tracks of a protection board, the power slots being powered via busbars connected to the primary power supply via at least one terminal block.

3. The assembly according to claim 1, in which the at least one modular connector incorporates a centering pin.

4. The assembly according to claim 1, in which the input connection module includes three phases and a neutral.

5. The assembly according to claim 1, in which the input connection module includes three phases.

6. The assembly according to claim 1, in which the input connection module includes one phase and a neutral.

7. The assembly according to claim 1, in which the input connection module includes one phase.

8. The assembly according to claim 1, in which the input connection module includes two phases.

9. The assembly according to claim 1, in which the input connection module includes two phases and a neutral.

10. The assembly according to claim 1, in which the at least one load is a powered device.

* * * * *